United States Patent [19]
Bosch et al.

[11] Patent Number: 5,626,716
[45] Date of Patent: May 6, 1997

[54] PLASMA ETCHING OF SEMICONDUCTORS

[75] Inventors: William F. Bosch, San Jose; Helen H. Zhu, Santa Clara; Syed A. Haider, Fremont, all of Calif.

[73] Assignee: Lam Research Corporation, Fremont, Calif.

[21] Appl. No.: 537,309

[22] Filed: Sep. 29, 1995

[51] Int. Cl.$^6$ .................................................. H01L 21/302
[52] U.S. Cl. ......................... 438/723; 252/79.1; 438/743
[58] Field of Search ........................... 156/643.1, 662.1, 156/646.1, 657.1, 655.1; 252/79.1

[56] References Cited

U.S. PATENT DOCUMENTS

| | | | |
|---|---|---|---|
| 5,021,121 | 6/1991 | Groechel et al. | 156/643 |
| 5,022,958 | 6/1991 | Favreau et al. | 156/643 |
| 5,038,713 | 8/1991 | Kawakami et al. | 118/723 |
| 5,160,398 | 11/1992 | Yanagida | 156/345 |
| 5,176,790 | 1/1993 | Arleo et al. | 156/643 |
| 5,269,879 | 12/1993 | Rhoades et al. | 156/643 |
| 5,314,575 | 5/1994 | Yanagida | 156/651 |
| 5,385,633 | 1/1995 | Russell et al. | 156/693 |
| 5,436,188 | 7/1995 | Chen | 437/52 |

FOREIGN PATENT DOCUMENTS 57-047800  3/1982  Japan.

OTHER PUBLICATIONS

Article entitled "Plasma Damage Measurements on Si Wafer by Electrode-Less CV" by Hiromichi Enami et al., DPS 1994 Proceedings of Symposium on Dry Processing, Nov. 10–11, 1994, Tokyo, pp. 169–173.

An Article entitled "Analysis of Mechanisms of Highly Selective Oxide Etching" by H. Enomoto et al., 1994 Dry Process Symposium, pp. 241 to/ 246.

*Primary Examiner*—R. Bruce Breneman
*Assistant Examiner*—George Goudreau
*Attorney, Agent, or Firm*—Irwin Ostroff; Arthur J. Torsigleri

[57] ABSTRACT

A dry etching process for use in the manufacture of silicon integrated circuit devices uses a mixture of about eight parts neon to one part $CHF_3$ (Freon 23) to form the etching plasma. The process etches doped oxides of silicon, such as BPSG and BPTEOS, in preference to undoped oxides of silicon, silicon nitride, silicides and silicon.

18 Claims, 1 Drawing Sheet

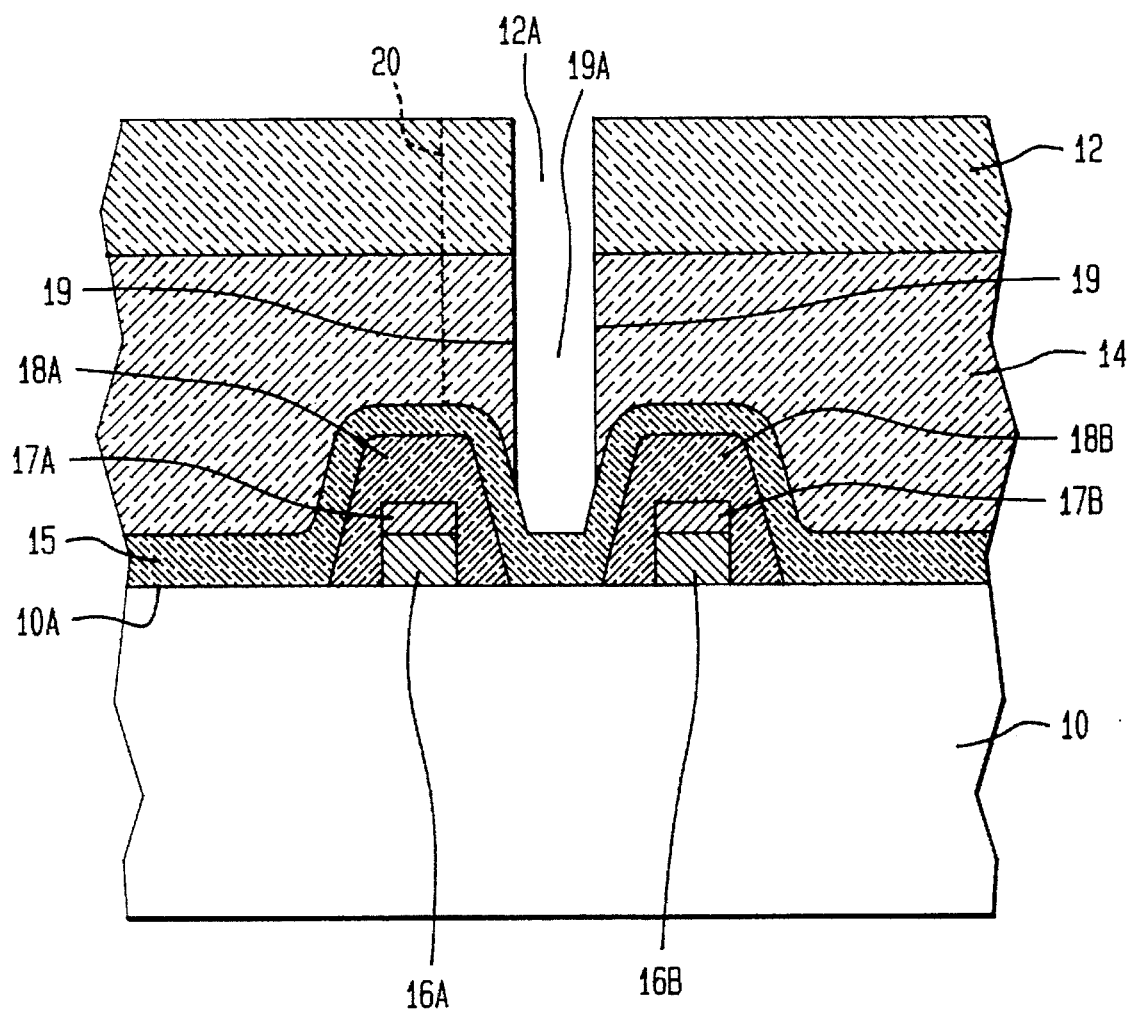
FIGURE

PLASMA ETCHING OF SEMICONDUCTORS

FIELD OF THE INVENTION

This invention relates to plasma etching of a silicon wafer in the manufacture of an integrated circuit.

BACKGROUND OF THE INVENTION

As the density of circuit components has increased and components have been shrunk in size and are spaced closer together, it has become increasingly difficult to access selectively a particular buried region of the silicon wafer workpiece through the various layers that are typically superposed on the surface of the silicon wafer without undesired interference with other active regions. In the absence of special measures to compensate for some misalignment in the masks, it is difficult to maximize the yield of good chips.

In particular, in the manufacture of chips with a high density of components, it is important to have a process for providing the various metalizations necessary in such chips that tolerates some misalignment of the masks used to define the metalizations.

It is especially important to have a technology that can etch openings that have essentially vertical side walls, when the openings are to extend deeply in the surface layers. Additionally, to tolerate some misalignment in the masks used to define such openings, it is advantageous to provide protection to regions that need isolation but inadvertently lie partially in the path of the projected opening. To this end it is sometimes the practice to surround such regions with a layer of material that resists etching by the process being used to form the openings.

Accordingly, a technology that provides the desired results will need an appropriate choice both of the materials used in the layers and the particular etching process used with the materials chosen.

Dry etching, such as plasma etching and reactive ion etching, has become the technology of choice in patterning various layers that are formed over a silicon wafer as it is processed to form therein high density integrated circuit devices. This is because it is a process that not only can be highly selective in the materials it etches, but also highly anisotropic. This makes possible etching with nearly vertical side walls.

Basically, in plasma etching as used in the manufacture of silicon integrated circuit devices, a silicon wafer on whose surface has been deposited various layers is positioned on a first electrode in a chamber that also includes a second electrode spaced opposite the first. As a gaseous medium consisting of one or more gases is flowed through the chamber, an r-f voltage, which may include components at different frequencies, is applied between the two electrodes to create a discharge that ionizes the gaseous medium and forms a plasma that etches the wafer. By appropriate choice of the gases of the gaseous medium and the parameters of the discharge, selective and anisotropic etching is achieved.

Various gaseous media has been used in the past for such etching, depending on the materials being etched, the selectivity that is needed, the profile sought for the side walls of the pattern being etched, and the rate desired for the etching step.

While elaborate theories have been developed to explain the plasma etching process, in practice most such processes have been developed largely by experimentation involving trial and error because of the relatively poor predictability of results otherwise.

Moreover, because of the number of variables involved and because most etching processes depend critically not only on the particular materials to be etched but also on the desired selectivity and anisotropy, such experimentation can be time consuming and success often depends on chance.

A dielectric layer, typically of a deposited oxide of silicon, such as a glassy silicate, is in common use in integrated circuits. A oxide of this kind is also used often in conjunction with a form that has been doped with either phosphorus or boron, or a mixture of both. It is known that the addition of the boron and phosphorus to such oxides can make such oxides more readily etched than the undoped form.

For example, in U.S. Pat. No. 5,022,958, issued on Jun. 11, 1991, there is described a process for manufacturing silicon integrated circuit devices that uses both a silicate glass in an undoped form (TEOS) and a silicate glass in a form doped both with boron and phosphorus (BPTEOS). For the selective etch of BPTEOS in preference to TEOS, a plasma etching process that employs a gaseous medium that includes both $CHF_3$ (Freon 23) and argon is used to readily etch windows in the BPTEOS layers with little effect on the TEOS layers.

Additionally, U.S. Pat. No. 5,021,121, issued on Jun. 4, 1991, teaches that an oxide of silicon doped with phosphorus is more readily etched than the undoped form by a plasma generated from a mixture of $CHF_3$ and an inert gas, argon or helium being the specific inert gases mentioned.

However, for use with submicron devices, an even higher degree of selectivity and anisotropy than those prior art processes provide would be advantageous and the invention is directed at such end.

SUMMARY OF THE INVENTION

A basic feature of the present invention is a dry etching process that is primarily designed to etch a layer of a doped oxide of silicon, such as a boron-phosphorus doped silicate glass (BPSG) or BPTEOS, not only more readily than the undoped form, but also more readily than silicon nitride and the various silicides that are often used as contact layers. In particular, the improved gaseous medium used for plasma etching in the invention includes a mixture of Freon 23 ($CHF_3$) and neon (Ne), preferably in the ratio by volume of about eight parts neon to 1 part Freon 23, as will be discussed in more detail subsequently.

While there is literature that includes neon in a list of inert gases suggested for use in gaseous mixtures to be used for plasma etching, neon appears never to have been singled out as providing any special advantage.

For example, U.S. Pat. No. 5,269,879, issued on Dec. 14, 1993, describes a process for etching that uses as the gaseous medium a mixture of a fluoride-containing gas of which Freon 23 is listed as one example, a passivating gas, typically nitrogen, and a carrier gas of which neon is included in a list of possible examples. However, there is no suggestion that the combination of Freon 23 and neon alone, offers any special advantage. Moreover, the process is described for etching a layer of silicon oxide/nitride selectively in preference to various metals.

Similarly, U.S. Pat. No. 5,038,713, issued on Aug. 13, 1991, describes a special form of etching apparatus and discloses for possible use in such apparatus gas mixtures that include both a gas from a first list of nineteen gases of which one is $CHF_3$ and a gas from a second list of eight other gases of which one is neon. Again there is no suggestion of the specific combination of $CHF_3$ and neon, much less of its use for specifically etching unisotropically a doped layer of a deposited oxide of silicon.

Accordingly, from one aspect the present invention is a dry etching process that includes the steps of flowing an appropriate gaseous mixture of Freon 23 and neon into an etching chamber that includes a pair of spaced apart electrodes of which one supports a silicon workpiece that includes a deposited layer of a doped oxide of silicon that is to be etched, and applying a radio frequency voltage between the two electrodes for creating a discharge that ionizes the gaseous medium and forms a plasma that etches the layer of the doped oxide of silicon.

From another aspect, the present invention is a process for the manufacture of an integrated circuit that includes forming various layer on a silicon wafer including a deposited layer of a doped oxide of silica and a layer of silicon nitride, and etching the layer of the doped oxide of silicon with a plasma formed from a mixture of Freon 23 and neon with a high degree of selectivity and anisotropy.

From another aspect, the invention is a gaseous medium for use in plasma etching that consists essentially of a mixture by volume of between four and sixteen parts neon and one part $CHF_3$.

From another aspect, the present invention is directed to a dry etching process for use in the manufacture of silicon integrated circuit devices. The process comprises a first step of positioning in the chamber of a plasma etching apparatus a silicon wafer having a surface layer that is to be etched; a second step of flowing a mixture of $CHF_3$ and neon into the chamber; and a third step of applying radio frequency energy to the chamber for providing a discharge in the chamber that ionizes the mixture and forms a plasma that etches the surface layer.

From another aspect, the present invention is directed to a process for etching a silicon wafer that includes surface layers of which one is a layer of silicon nitride and another is a layer of a doped oxide of silicon that is to be etched preferentially to the layer of silicon nitride. The process comprises a first step of positioning the silicon wafer to be etched in a plasma etching apparatus; and then the step of flowing a gaseous medium comprising a mixture of $CHF_3$ and neon gas through the apparatus to ionize the gaseous medium and create a plasma that etches preferentially the exposed surface of the doped oxide of silicon layer to form an opening in such layer.

From another aspect, the present invention is directed to a process for the manufacture of silicon integrated circuit devices. The process comprises a first step of preparing a silicon wafer that includes on a silicon surface a plurality of layers including deposited layers of doped and undoped oxides of silicon; a second step of positioning the wafer on one of the two electrodes of a plasma etching apparatus; a third step of passing a gaseous mixture of $CHF_3$ and neon through the apparatus; and a fourth step of applying a radio frequency voltage between the two electrodes of the apparatus for generating a discharge that ionizes the gaseous mixture and creates a plasma that etches selectively the layer of doped oxides of silicon.

From another aspect, the present invention is directed to a gaseous mixture for use in dry etching that consists essentially of between 4 and 16 parts neon and one part $CHF_3$.

From another aspect, the present invention is directed to a gaseous mixture for use in dry etching that consists essentially of about eight parts neon and one part $CHF_3$.

Viewed from still an other aspect, the present invention is directed to a method for reactive ion etching selectively a layer of silicon nitride on a silicon wafer that includes at least one layer of an oxide of silicon that is not to be etched. The method comprises the steps of positioning the wafer in a plasma reactor that includes a chamber within which there can be created a radio frequency discharge, and flowing through the chamber a gaseous medium that when subjected to the radio frequency discharge generates a plasma that includes reactive ions, the mixture consisting essentially of between about 10 to 25 percent $CHF_3$ with the remainder oxygen.

The invention will be better understood from the following more detailed description taken with the accompanying drawings.

BRIEF DESCRIPTION OF THE DRAWINGS

The single FIGURE shows a silicon wafer on whose surface has been deposited a succession of layers including a layer of a boron-phosphorus doped oxide of silicon in which vias are first to be etched, and within which vias conductive material is subsequently to be deposited to make direct electrical or capacitive contact to surface regions of the silicon wafer.

DETAILED DESCRIPTION

The FIGURE shows in cross section, but not to scale, a portion of a silicon wafer 10 that includes on an upper surface 10A thereof various layers that have been deposited thereover in the process of manufacturing integrated circuits. At the stage of the process illustrated, the various layers include a layer of a patterned photoresist 12. Layer 12, which defines openings 12A therethrough, serves as a mask for the selective etching of a layer 14 of a doped oxide of silicon therebelow. In accordance with the preferred embodiment of the invention, this layer 14 is of a deposited-oxide of silicon doped with both boron and phosphorus, of the kind generally described in the art as boron-phosphorus silicate glass (BPSG). Typically each dopant makes up 4 plus or minus one percent by weight of the glass. Alternatively, either of the two dopants may be used alone. Other oxides of silicon that may be substituted include similarly doped oxides deposited by heating the wafer in an atmosphere of tetraethyloxysilane and the dopants to form an oxide known as BPTEOS. A layer 15 about 500 to 1000 Angstroms thick, preferably of silicon nitride or other material such as undoped silicon oxide or silicon oxynitride, that can serve as a stop to limit the penetration of a first etching step, overlies portions of the top surface 10A of the silicon wafer 10 and is below layer 14. In some regions there may be a layer of thermally grown silicon oxide (not shown) between the silicon surface 10A and layer 15.

Spaced apart electrical contacts 16A and 16B make electrical contact with portions of surface 10A and typically comprise runners of polysilicon which are heavily doped so as to be conductive. The electrical contact typically will be a direct physical contact but in some instances it could be a capacitive contact when there needs to be an oxide layer below the contact. Electrical contacts 16A and 16B are advantageously topped with layers 17A and 17B, respectively, of a conductive silicide such as titanium silicide. Dielectric spacers 18A and 18B on the sidewalls of the polysilicon runner 16A and layer 17A and polysilicon runner 16B and layer 17B, respectively, are useful as a difusion mask. The spacers 18A and 18B typically also have a portion that extends over the titanium silicade topped polysilicon contacts 17A and 17B, respectively, as is seen in the FIGURE. Layers 18A and 18B advantageously are of the undoped deposited oxide of silicon known as TEOS, which will be little affected by a first etchant used to etch the layer 14. These layers 18A and 18B can also be nitride. Additionally, the silicon nitride layer 15 extends over the layers 18A and 18B. The broken line 19 defines the sidewalls of an opening 19A to be formed in the BPSG layer 14 by a first plasma etching step. As depicted in the FIGURE, because the etching is selective, it does not disturb the dielectric 15 in portions thereof which cover layers 17A and 17B and electrical contacts 16A and 16B. This is important since the opening 19A formed by the etching is later to be filled with a conductor (not shown) typically to make a low resistance contact to surface 10A of the wafer 10. In some instances it may be necessary to contact the surface 10A capacitively when it is advantageous to leave a layer of thermally grown silicon oxide between the conductor (not shown) and the silicon surface. Were this conductor to make electrical contact also to the layers 17A, 17B, 16A, or 16B, an electrical short would arise that would be disabling and make for a defective device.

A separate second etching step, as will be described below, is advantageously used to remove selectively the layer 15 at the bottom of the opening 19A so that the conductive fill to be deposited can make good electrical contact to the silicon wafer surface 10A with little effect on any TEOS (such as spacers 18A and 18B) or silicon oxide that may be encountered.

An important feature of the invention is the particular etching technique used to achieve an opening in the layer 14 of the kind required to achieve high yields even when some the path of the opening 19A deviates from the optimum because of imperfect mask alignment.

As indicated previously, the present invention uses as the gaseous medium that is ionized to form the etching plasma, a mixture of $CHF_3$ (Freon 23) and neon. The mixture preferably includes only $CHF_3$ and neon, although it is possible that minor fractions of other gases may usefully be included for special cases. Usually, the mixture should include between four and sixteen parts of neon to one part of $CHF_3$ by volume, the greater the neon fraction the slower but more selective the etching.

The presently preferred mixture for a good compromise is about eight parts neon to one part $CHF_3$ by volume with the $CHF_3$ being flowed into the chamber at the rate of about 50 sccm and the neon at a rate of about 400 sccm. The radio frequency (r-f) of the voltage used to generate the plasma preferably is the usual 13.56 megahertz. For etching an 8 inch wafer that is currently the state of the art size wafer, the r-f power supplied for the discharge preferably is in the range of between 700 and 1100 watts. The higher the power the faster the etching rate but with some loss in selectivity. The optimum pressure in the chamber for 0.45 micron openings for the vias is about 100 mT with the optimum pressure decreasing the finer the scale of the etching.

Under the preferred conditions described, the etching is not only highly anisotropic, but also highly selective and little affects either silicon nitride or undoped oxides of silicon. Accordingly, it is highly effective for the material systems described. Moreover, the etching process described also appears to little affect the various silicides of silicon that have been used for making low resistance contacts to silicon and polysilicon. In a preferred embodiment the etching by the preferred mixture is substantially reactive ion etching.

As a result, the etching can proceed safely even if there is some misalignment of the mask opening 12A.

Subsequently, by a second etching step, in accordance with another feature of the process of the present invention, the portion of the silicon nitride layer 15 remaining at the bottom of the newly formed opening 19A in the layer 14 is removed. This second etching step is done with a plasma formed by ionizing a gaseous mixture of Freon 23 and oxygen which removes selectively the exposed silicon nitride layer 15 while leaving substantially unaffected the TEOS layer. It has been found that the mixture of Freon 23 and oxygen etches silicon nitride but little affects TEOS or silicon oxide. In a typical example $CHF_3$=10 SCCM, $O_2$=90 SCCM, the r-f power is about 150 Watts, and the pressure is about 100 mT. One set of useful ranges is 10–20 SCCM for $CHF_3$, 70–110 SCCM for $O_2$, 100–200 Watts for r-f power, and 100–200 mT for pressure.

Summing up, as has been discussed earlier, while neon has on occasion been mentioned as a possible candidate for use in a gaseous mixture for plasma etching, there appears to be no teaching of any possible advantages making such use preferable to the use of argon, the usual diluent. We have found not only that the use of neon provides a satisfactory high degree of selectivity, but that its use also provides a better profile for the side wall of the etched opening than does argon, the diluent normally of choice for mixing with $CHF_3$. In particular, the use of neon gives a sharper edge to the top of the opening such that there is less undesirable widening of the opening at its top. This facilitates designs with closer spacing between portions of a semiconductive circuit and thus higher density integrated circuits. We have also found that a combination of Freon 23 and oxygen is very useful for etching silicon nitride.

It can be appreciated that the specific embodiment described is merely illustrative of the basic principles involved and that various modifications can be made thereto by a worker in the art without departing from the spirit of the invention.

What is claimed is:

1. A dry etching process for use in the manufacture of silicon integrated circuit devices comprising the steps of:
   positioning in the chamber of a plasma etching apparatus a silicon wafer having a surface layer of a doped oxide of silicon that is to be etched;
   flowing a mixture consisting essentially of $CHF_3$ and neon into the chamber; and
   applying radio frequency energy to the chamber for providing a discharge in the chamber that ionizes the mixture and forms a plasma that etches the surface layer.

2. The process of claim 1 in which the gaseous mixture includes between 4 and 16 parts neon to one part $CHF_3$ by volume.

3. The process of claim 1 in which the gaseous mixture includes eight parts neon to one part $CHF_3$.

4. A process for the manufacture of silicon integrated circuit devices comprising the steps of:
   preparing a silicon wafer that includes on a silicon surface a plurality of layers including layers of doped and undoped oxides of silicon;
   positioning the wafer on one of the two electrodes of a plasma etching apparatus;
   passing a gaseous mixture consisting essentially of $CHF_3$ and neon through the apparatus; and
   applying a radio frequency voltage between the two electrodes of the apparatus for generating a discharge that ionizes the gaseous mixture and creates a plasma that etches selectively layers of doped oxides of silicon in preference to layers of undoped oxides of silicon.

5. The process of claim 4 in which the plasma that etches is predominantly reactive ion etching.

6. The process of claim 4 characterized in that the doped layers are doped with dopants from the group consisting of boron and phosphorus and mixtures thereof.

7. The process of claim 1 in which the $CHF_3$ and the neon flow into the chamber at a rates of 400 sccm and 50 sccm, respectively, and the pressure in the chamber is maintained at 100 millitores.

8. The process of claim 7 in which the r-f energy applied is maintained between 700 and 1100 watts.

9. A process for etching a silicon wafer that includes surface layers of which one is a layer of silicon nitride and another is a layer of a doped oxide of silicon that is to be etched preferentially to the layer of silicon nitride comprising the steps of:

positioning the silicon wafer to be etched in a plasma etching apparatus; and flowing a gaseous medium consisting essentially of a mixture of $CHF_3$ and neon gas through the apparatus to ionize the gaseous medium and create a plasma that etches preferentially the exposed surface of the doped oxide of silicon layer to form an opening in such layer.

10. The process of claim 6 in which the gaseous mixture is between four and sixteen parts neon to one part $CHF_3$.

11. The process of claim 9 in which the gaseous medium being flowed through the apparatus is eight parts neon to one part $CHF_3$.

12. The process of claim 10 in which the layer of doped oxide of silicon is a layer of a silicate glass doped with approximately equal parts of boron and phosphorus.

13. The process of claim 12 in which boron and phosphorus are each four per cent of the silicate glass.

14. The process of claim 14 in which the mixture of $CHF_3$ and neon is eight parts neon and one part $CHF_3$.

15. The process of claim 14 in which the layer of doped oxides of silicon is a layer of a silicate glass doped with equal parts of boron and phosphorus.

16. The process of claim 14 in which the layer of doped oxides of silicon is doped with four percent boron and four per cent phosphorus.

17. The process of claim 14 in which the wafer has a diameter of eight inches and the radio frequency energy applied for generating the discharge is between 700 and 1100 watts.

18. The process of claim 1 in which the silicon wafer being etched includes a surface layer of a doped oxide of silicon and at least one layer of a composition from the group consisting of silicon nitride, undoped oxides of silicon, and oxynitrides, the plasma etching the doped oxide preferentially with respect to the other compositions.

* * * * *